United States Patent [19]
Mayo, Jr.

[11] Patent Number: 4,697,594
[45] Date of Patent: Oct. 6, 1987

[54] DISPLAYING A SINGLE PARAMETER IMAGE

[75] Inventor: William T. Mayo, Jr., Seal Beach, Calif.

[73] Assignee: North American Philips Corporation, New York, N.Y.

[21] Appl. No.: 767,948

[22] Filed: Aug. 21, 1985

[51] Int. Cl.$^4$ ............................ A61B 6/00; A61B 105/00
[52] U.S. Cl. .................................... 128/653; 128/660; 358/82; 358/112; 358/111; 382/52
[58] Field of Search ................................. 73/599–600; 128/653, 659–661, 663, 664; 343/5 CD; 358/81–82, 110–113; 364/521; 367/11; 382/52

[56] References Cited

U.S. PATENT DOCUMENTS

| | | | |
|---|---|---|---|
| 3,761,607 | 9/1973 | Houseman | 358/81 |
| 4,125,858 | 11/1978 | Hounsfield et al. | 358/82 |
| 4,183,046 | 1/1980 | Dolke et al. | 358/81 X |
| 4,318,413 | 3/1982 | Iinuma et al. | 128/663 X |
| 4,412,544 | 11/1983 | Beretsky et al. | 128/660 |
| 4,415,922 | 11/1983 | Reymond et al. | 358/81 X |
| 4,453,550 | 6/1984 | Flax | 128/660 |
| 4,503,461 | 3/1985 | Nishimura | 128/663 |
| 4,543,826 | 10/1985 | Ferrari | 128/660 X |
| 4,584,880 | 4/1986 | Matzuk | 128/660 X |

FOREIGN PATENT DOCUMENTS

2089168  6/1982  United Kingdom .................. 358/81

OTHER PUBLICATIONS

Gosch, J., "Computerized X-ray Process Shows Blood Rate as Color TV Picture", Electronics (May 10, 1979), vol. 52, No. 10, pp. 68, 70, (copy 358/81).

Hoshino, H. et al., "Microprogrammable UTS Image Processor and its Applications to Image Manipulation", SPIE, vol. 314, Digital Radiography (1981), pp. 354–361, (copy 128/660).

Ophir, J. et al., "Digital Scan Converters in Diagnostic UTS Imaging", Proceedings IEEE, vol. 67, #4, Apr. 1979, pp. 654–664, (copy 128/660).

Nimehawa, K., "UTS Bloodflow Imaging Method & Apparatus", published European Patent Appln. EP0100094, Feb. 1984, (copy 128/660).

Sams, H. W., "Color TV Training Manual", Chapter 1, Howard Sams & Company, Indianapolis, Ind.; ©1970, pp. 9–21, (copy AU335).

Primary Examiner—Kyle L. Howell
Assistant Examiner—Francis J. Jaworski
Attorney, Agent, or Firm—Jack E. Haken

[57] ABSTRACT

A method and apparatus for displaying an image which has a wide dynamic range. Low spatial frequency components of the image are extracted from the image signal and are presented as a color overlay which tints an intensity modulated display of local high spatial frequency image components. In a preferred embodiment, the hue of the color overlay is modulated to indicate whether the local background component is greater than or less than an equilibrium value while the saturation is modulated to indicate the absolute value of the deviation.

22 Claims, 4 Drawing Figures

DISPLAYING A SINGLE PARAMETER IMAGE

The invention relates to a method and apparatus for displaying data. More particularly, the invention relates to a method and apparatus for producing a display wherein the intensity of each pixel represents high resolution, local variations of a displayed parameter while the color of the pixel is tinted to provide a low resolution display of the local average value of the parameter. The invention is particularly useful for displaying medical diagnostic images which are produced, for example, by echo ultrasound or other digital imaging modalities.

BACKGROUND OF THE INVENTION

Under ideal conditions, the human visual system is only able to perceive from four to six bits of dynamic range (from 16 to 64 distinct gray levels) in a monochrome image. The actual number of bits perceived is further reduced in the presence of additive glare (background lights) which usually means that a darkened room is required for presentation of images with a large dynamic range. The perceived dynamic range of an image may be increased by reducing the amplitude of lower spatial frequencies (by homomorphic filtering), but this dynamic range reduction is detrimental to effective diagnosis of medical images, particularly ultrasound images, which makes use of the presence of shadowing and/or bright-up.

It is well known that pseudocolor enhances human perception of gray scales and enables an observer to quantify a single parameter image. It has also been shown that color can allow the eye-brain combination to form useful correlations on multidimensional image data, if it can be used in a pleasing manner. However, many medical radiologists do not like pseudocolor images.

It is known that separate use of red, green and blue to image three independent variables leads to confusing images. A more natural presentation is used in commercial color television and in map making where a primary image is shown as a high (spatial) resolution intensity image and secondary parameters are visualized by color tinting (which typically has less spatial resolution than the primary image). Thus, the hue (color) and the saturation (purity of color) can be used to present two independent low-resolution variables which are superimposed on a high resolution intensity image.

FIG. 1 schematically illustrates a two-dimensional chromaticity space of hue and saturation in polar coordinates.

In the figure, S=0 is white (zero color saturation) and the circle S=1 represents pure monochromatic colors (fully saturated). In this model, locations near S=0 are pastel colors.

In the prior art, three parameters of position in an image (such as a(x,y), f(x,y) and g(x,y)) were respectively assigned to Intensity, Hue and Saturation as, for example:

| | | |
|---|---|---|
| Intensity: | $I(x,y) = K_i a(x,y)$ | (1) |
| Hue: | $H(x,y) = K_h f(x,y)$ | (2) |
| Saturation: | $S(x,y) = K_s g(x,y)$ | (3) | where $K_i$, $K_h$, and $K_s$ are constants.

The simplest use of these relations is to set S=0 (which implies that the hue is irrelevent). Black and white intensity images are thus produced from the function a(x,y).

In the usual prior art pseudocolor display, the parameter, I(x,y) is a constant, S is unity (fully saturated color), and the parameter f(x,y) is imaged with hue as the only variable. Many people find such images distasteful.

In a more acceptable prior art method, "color tinting" of a gray scale image is accomplished using all three equations. If two parameters are of interest, it is common to set S equal to a constant and to use I(x,y) and H(x,y) as the parametric variables. Color tinting of a black and white image usually conveys low resolution information as an overlay through which the observer can see an image of intensity information a(x,y) in the same manner as a color tinted black and white photograph. If S is chosen as unity, this scheme is still unsatisfying to many observers. More pleasing images are formed if S is set to a small value which presents all colors as unsaturated pastels.

Many algorithms for compressing the dynamic range of a one-dimensional image exist in the prior art. For example, homomorphic filtering which can emphasize local high frequency variations in an image while suppressing low spatial frequency variations is described in Oppenheim, Schaffer and Stockham, "Nonlinear Filtering of Multiplied and Convolved Signals", Proceedings of the IEEE, Vol. 56, pgs. 1264–1291 (1968) and in "Digital Image Restoration", Andrews and Hunt, Prentice-Hall Inc., 1977, which are incorporated herein, by reference, as background information. In one such technique, the average value of pixels in the local two-dimensional region surrounding each pixel is computed and is divided into the value of the individual pixel. The quotient represents the local, high frequency variation and is used to intensity modulate the display of the pixel. This results in a compression, similar to AGC compression of audio signals. However, these techniques generally "throw-away" the low spatial frequency, background information from the image.

SUMMARY OF THE INVENTION

In accordance with the invention, low frequency background information is displayed as a color tint which overlays an intensity modulated display of a high spatial frequency, compressed image. The invention thus converts low frequency information, which is normally discarded by compression, into another form which the observers can simultaneously perceive in conjunction with the compressed, high frequency image.

My copending patent application Ser. No. 767,457 filed Aug. 20, 1985 discloses a method and apparatus for simultaneously displaying two parameters in an image which can advantageously be utilized with the present invention. A combination of hue and saturation coding is used to overlay a display of a secondary parameter on an intensity modulated display of a primary parameter.

In accordance with that invention, a second parameter f(x,y) is used to tint an intensity image I(x,y)=a(x,y) by controlling a combination of hue H(x,y) and saturation S(x,y) at each pixel so that the hue of the pixel is determined by the sign of the deviation of the value of the second parameter from a reference value, $f_0$, and the saturation of the pixel is proportional to the absolute value of that deviation. For example:

when $f(x,y) \leq f_0$: $H(x,y) =$ Blue $$S(x,y) = C_1 \frac{f_0 - f(x,y)}{(f_0 - f_{min})}$$

and when $f(x,y) \geq f_0$: $H(x,y) =$ Red $$S(x,y) = C_1 \frac{f(x,y) - f_0}{(f_{max} - f_0)}$$

where $C_1$, $f_{max}$, $f_{min}$, and $f_0$ are constants. Thus, as f increases from its minimum to its maximum, the chromaticity follows a path, as illustrated in FIG. 1, from a relatively saturated blue through the pastel shades of blue through white and then through a pastel and into a relatively saturated red color. Any radial path inward from a saturated color to white and out again along another radial path to some contrasting color may be used. In a preferred embodiment, the path begins and ends at somewhat unsaturated pastel colors as this seems to provide a more pleasing image.

The principle features of the displayed image are:

(1) when the low frequency component does not deviate from its reference or equilibrium value, then the image is black and white without color tint; and (2) the color overlay has a liner (one dimensional) directional sense (for example: from blue to red) which may be mentally associated as left-right, up-down, hot-cold, good-bad, big-little, etc. In contrast, conventional hue modulation alone has "circular loop" connotations which can sometimes be disorienting.

In a preferred embodiment of the present invention, the low frequency background variation of a compressed image is used as a secondary parameter to modulate the hue and saturation of the pixels so that, for example, shadow areas of the image are displayed as ice blue, average density regions of the image are displayed in shades of grey and highlights of the image are displayed with an intense red overlay.

BRIEF DESCRIPTION OF THE DRAWINGS

The invention can be understood by reference to the attached drawings in which.

DESCRIPTION OF THE PREFERRED EMBODIMENT

Figure 2:
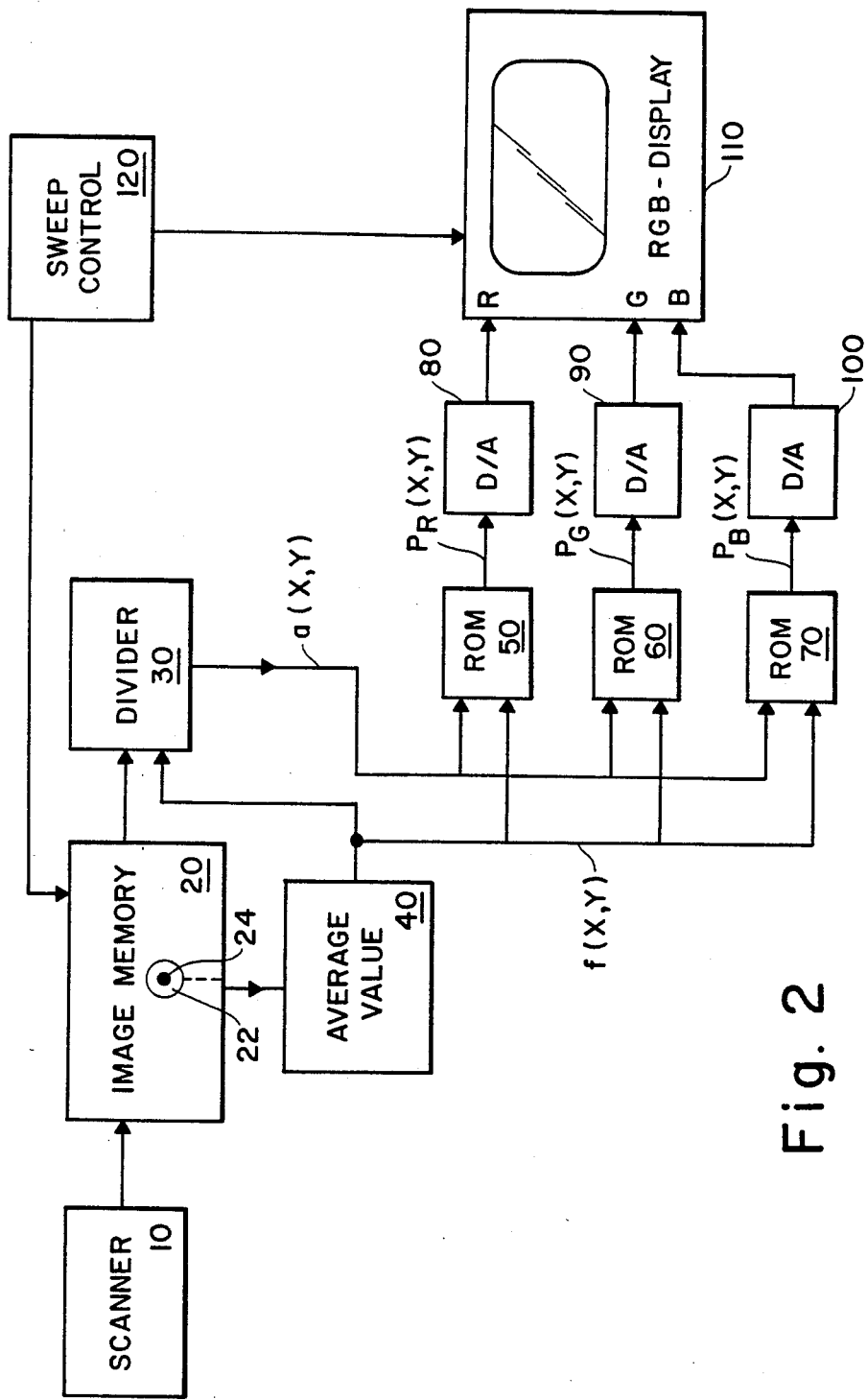
FIG. 2 is an image display system which incorporates the invention.

FIG. 2 is a block diagram of an image display system which incorporates the invention. A scanner 10 produces a stream of digital data wherein each word represents the value of an imaged parameter at a discrete point in an image matrix. The scanner 10 may, for example, be an echo ultrasound scanner, an X-ray computed tomography scanner, a magnetic resonance imaging device, a digital subtraction radiography system, or a similar medical imaging device. Alternately, the scanner could represent the output of an electron microscope, a computer graphics unit, or a radar system. At the output of the scanner 10, the data which represents points in the image can each assume more than from 16 to 64 discrete values and each word is therefore represented by more than from 4 to 6 bits. Typically, each image point will be represented by from 8 to 32 bits. Data from the output of the scanner 10 is stored in an image memory 20. The image memory contain a discrete, addressable memory cell for each point in the image.

The contents of the image memory 20 are scanned, by addressing the memory on an image point-by-image point basis and the successive values at image points 22 in the image matrix are fed to a first input of a digital dividing circuit 30. At the same time, the values of all image points in a local area 24 of the matrix, which surrounds the addressed image point 22, are fed to an average value computing circuit 40. The average value of the image points in the area 24 is a measure of the low spatial frequency background components f(x,y) at the addressed image point 22. The high order bits from the output of the average value circuit 40 are fed to a second input of divider circuit 30.

The average value circuit 40 and divider circuit 30 function as a two-dimensional, homomorphic low-pass filter which extracts a slowly varying background component from the image signal. Alternately, other known types of low-pass filters may be utilized. In some applications it is also possible to extract the background component of the image signal using a one-dimensional filter. For example, the background component can be extracted from echo-ultrasound or radar signals with a one-dimensional low-pass filter which operates on the logarithm of the A-line signals in the time domain.

Alternately, if the image signal is subjected to logarithmic compression before it is stored in the image memory, a subtraction circuit can be utilized in place of the divider circuit 40.

The divider circuit 30 divides the first input, which is the value of image point 22, by the low frequency component f(x,y) to yield a function a(x,y) which represents the high spatial frequency, low order bit variation at image point 22. The high order bits of the low spatial frequency component, f(x,y), and the low order bit of the high spatial frequency component, a(x,y), are combined respectively as the high order and low order bits of an address word which is used to address the respective contents of three read-only memories (ROM's) 50, 60, and 70. Read-only memories 50, 60, and 70 respectively contain look-up tables which determine, from the values of the functions f(x,y) and a(x,y) the values of the red, green, and blue components of a corresponding pixel in a display of the image. The outputs of read-only memores 50, 60, and 70 are fed, respectively, through digital-to-analog converters 80, 90 and 100 to the red, green, and blue inputs of an RGB CRT display 110. A sweep control circuit 20 generates horizontal and and vertical sweep signals to produce a raster scan on the display 110 and to simultaneously address the scan-in image memory 20, so that the image memory cells 22 in the image memory 20 are mapped to corresponding pixels on the face of the CRT in the display 110.

In a preferred embodiment of the invention, the look-up tables in the ROM memories 50, 60, and 70 respectively generate a red signal, R(x,y), a green signal G(x,y), and a blue signal B(x,y) in accordance with the formulas

---

$I(x,y) = K_i a(x,y)$
$R(x,y) = P_R(x,y) I(x,y)$
$G(x,y) = P_G(x,y) I(x,y)$
$B(x,y) = P_B(x,y) I(x,y)$

Figure 1:
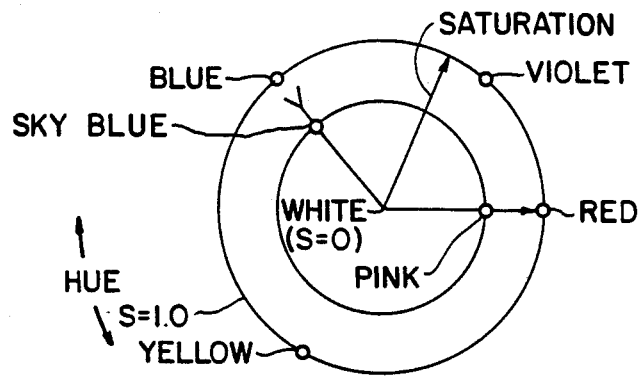
FIG. 1 is a simplified chromaticity diagram which illustrates the invention.
Figures 3A, 3B:
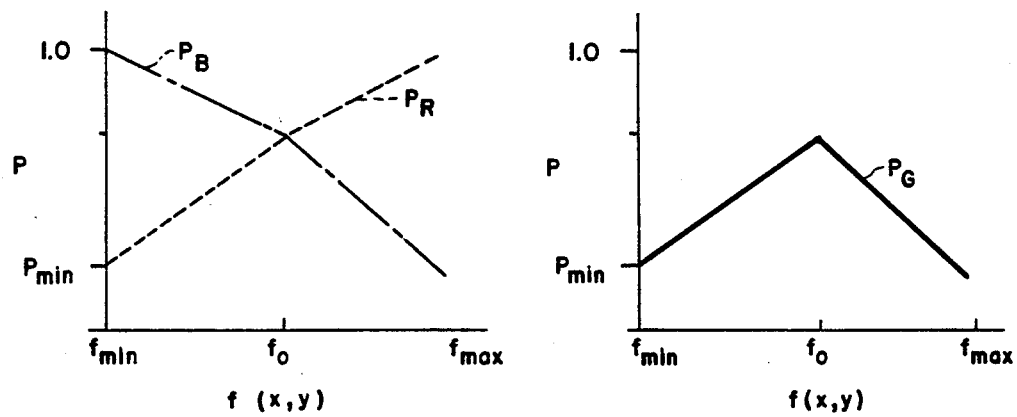
FIGS. 3a and 3b are plots of RGB multiplier values.

--- where the multiplier values $P_R$, $P_G$ and $P_B$ are all less then unity and are functions of f(x,y) determined according to the mapping illustrated by the straight lines in FIGS. 3a and 3b. When $P_{min}$ differs from zero, maximum saturation is not obtained. When the output of the average value circuit 40 is equal to the nominal value of the image intensity, $f_0$, all three color guns are balanced to produce a nominally white pixel.

As shown in FIGS. 3a and 3b is also possible to obtain a particularly pleasing modulation scheme by varying the value of $P_W$. That is to say the value of the intensity (I=R+G+B) is in fact slightly modulated by f(x,y).

I claim:

1. A method for displaying an image from an image signal which includes values of a parameter at a large number of image points and which has a wide dynamic range, comprising the steps of:
   for each image point:
      determining the two-dimensional, local average value of the parameter in a region surrounding the image point to obtain a low spatial frequency, background value at the image point;
      dividing the value of the parameter at the image point by said background value to obtain a compressed value of a high spatial frequency component of the image at the image point;
      modulating the intensity of a corresponding pixel in a display with the compressed value; and
      modulating the hue of the corresponding pixel to a first color when the background value is greater than a predetermined reference value, modulating the hue of said pixel to a second, complementary color when the background value is less than the reference value and modulating the saturation of the color of the pixel in proportion to the absolute value of the deviation of the background value from the reference value.

2. The method of claim 1 wherein the image signal represents a medical diagnostic image.

3. The method of claim 2 further comprising the step of producing the image signal in an echo-ultrasound scanner.

4. The method of claim 3 wherein the first color is red and the second color is blue.

5. The method of claim 2 further comprising the step of producing the image signal in an X-ray computed tomography scanner.

6. The method of claim 2 further comprising the step of producing the image signal in a digital subtraction radiography system.

7. The method of claim 2 wherein the first color is red and the second color is blue.

8. A method for displaying an image from an image signal which includes values of a parameter at a large number of image points and which has a wide dynamic range, comprising the steps of:
   filtering the image signal to extract, at each image point, a low spatial frequency background signal component and a rapidly varying local signal component;
   compressing the dynamic range of the local signal component;
   displaying each image point by modulating the intensity of a corresponging image pixel to represent the compressed local signal component at the image point and modulating the color of the pixel to prepresent the backgound signal component.

9. The method of claim 8 wherein the filtering step comprises filtering the image signal with a low-pass filter.

10. The method of claim 9 wherein the filtering step comprises filtering the image signal with a two-dimensional low-pass filter.

11. The method of claim 9 wherein the low-pass filter is a homomorphic filter.

12. The method of claim 8 wherein the step of modulating the color of the pixel comprises
   displaying the background signal component by modulating the hue of the corresponding pixel to a first color when the background signal component is greater than a predetermined reference value, modulating the hue of said pixel to a second, complementary color when the background signal component is less than the reference value and modulating the saturation of the color of the pixel in proportion to the absolute value of the deviation of the background signal component from the reference value.

13. The method of claim 9 wherein the step of modulating the color of the pixel comprises
   displaying the background signal component by modulating the hue of the corresponding pixel to a first color when the background signal component is greater than a predetermined reference value, modulating the hue of said pixel to a second, complementary color when the background signal component is less than the reference value and modulating the saturation of the color of the pixel in proportion to the absolute value of the deviation of the background signal component from the reference value.

14. Apparatus for displaying an image comprising:
   means which produce an image signal which represents parameter values at a large number of image points and which has a wide dynamic range;
   filter means which extract a low spatial frequency, background component of the image signal;
   display means which map each image point represented by the image signal into a corresponding pixel on an image display;
   means which modulate the intensity of each pixel to represent a high spatial frequency component of the image signal at the corresponding image point; and
   means which modulate the color of each pixel to represent the background component of the image signal at the corresponding image point.

15. The apparatus of claim 14 wherein the means which modulate the color represent the low frequency, background component by modulating the hue of the corresponding pixel to a first color when the background component is greater than a predetermined reference value, modulating the hue of said pixel to a second, complementary color when the background component is less than the reference value and modulating the saturation of the color of the pixel in proportion to the absolute value of the deviation of the background component from the reference value.

16. The apparatus of claim 14 wherein the filter means comprises a two-dimensional homomorphic filter.

17. The apparatus of claim 16 wherein the means which modulate the color represent the low frequency, background component by modulating the hue of the corresponding pixel to a first color when the background component is greater than a predetermined reference value, modulating the hue of said pixel to a second, complementary color when the background component is less than the reference value and modulating the saturation of the color of the pixel in proportion to the absolute value of the deviation of the background component from the reference value.

18. The apparatus of claim 17 wherein the means which produce the image signal is an echo-ultrasound scanner.

19. The apparatus of claim 18 wherein the first color is red and the second color is blue.

20. The apparatus of claim 14 wherein the means which produce the image signal comprises an echo-ultrasound scanner.

21. A method for producing an image from data which represents the values of a single parameter at a plurality of points in a two-dimensional space comprising the steps of:

separating the data into a first component which represents high spatial frequency information in the image and a second component which represents low spatial frequency, background information in the image;

modulating the intensity of pixels in the image with the first component so that the high spatial frequency component is displayed across an available dynamic range of pixel intensities and modulating the color of the pixels in the image with the second component, whereby the perceived dynamic range of the parameter in the image is greater than the dynamic range which would be perceptible if intensity modulation alone was used to display the image.

22. The method of claim 21 wherein the step of modulating the color comprises modulating the saturation of the color of the pixels in proportion to the abolute value of the second component.

* * * * *